United States Patent
Huang et al.

(10) Patent No.: US 6,291,255 B1
(45) Date of Patent: Sep. 18, 2001

(54) TFT PROCESS WITH HIGH TRANSMITTANCE

(75) Inventors: Ting-Hui Huang, Hsinchu; I-Min Lu, Taipei; Shih-Chang Chang, Pa Teh, all of (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/577,358

(22) Filed: May 22, 2000

(51) Int. Cl.$^7$ .................................................. H01L 21/84
(52) U.S. Cl. .............................................. 438/30; 438/151
(58) Field of Search ..................... 438/151–166, 438/30

(56) References Cited

U.S. PATENT DOCUMENTS

| | | | |
|---|---|---|---|
| 5,403,755 | * | 4/1995 | Chae . |
| 5,956,579 | * | 9/1999 | Yamazaki et al. .................... 438/151 |
| 6,010,921 | * | 1/2000 | Soutome ............................... 438/151 |
| 6,025,216 | * | 2/2000 | Ha .......................................... 438/161 |

* cited by examiner

Primary Examiner—Richard Booth

(57) ABSTRACT

A method for manufacturing TFT (Thin Film Transistor) panel with high transmittance includes an intermediate-layer process. After the intermediate-layer process has been executed, the TFT panel is etched to remove the silicon nitride layer without coverage of the source conductive pattern and the drain conductive pattern. The transmittance of the portion of the TFT without shield of the source conductive pattern and the drain conductive pattern is thus higher than that of the portion of the TFT with the shield of the source conductive pattern and the drain conductive pattern. The intermediate-layer process in the preferred embodiment of the present invention has three aspects. In the first aspect, the first step is to bake the TFT panel. The second step is to form the contact hole in the insulating layer of the TFT panel. The third step is to form the source conductive pattern and the drain conductive pattern. In the second aspect, the first step is to form the contact hole in the insulating layer of the TFT panel, then form the source conductive pattern and the drain conductive pattern are formed, followed by the baking of the TFT panel including the source conductive pattern and the drain conductive pattern. In the third aspect, the first step is to form the contact hole in the insulating layer of the TFT panel, then sputtering a metallic layer on the TFT panel followed by a baking step.

18 Claims, 5 Drawing Sheets

TFT PROCESS WITH HIGH TRANSMITTANCE

BACKGROUND OF THE INVENTION

1. Field of the Invention

This invention relates to a method for manufacturing TFT (Thin Film Transistor), and particularly relates to a method for manufacturing TFT that has high transmittance.

2. Description of the Prior Art

In fabricating TFT (Thin Film Transistor) LCD (Liquid Crystal Display) panel utilizing LTPS (Low Temperature Polycrystalline Silicon) technology, because the mobility of electrons can be greatly raised, the manufacture of high quality TFT-LCD panel is enabled, and the cost is lowered by reducing the number of connecting lines. Usually, the silicon nitride (SiNx) is utilized in the LTPS technology to form the interlayer or the passivation layer to been proceed with the hydrogenation process. The LTPS technology is designed to fabricate the LCD panel having high transmittance and high aperture rate, but the silicon nitride (SiNx) layer will lower the transmittance of the LCD panel. So the frequently utilized silicon nitride (SiNx) layer in the LTPS technology will degrade the performance of the LCD panel fabricated by the LTPS technology.

In the prior art LTPS technology utilized to form the TFT LCD, the silicon nitride layer is necessary for the hydrogenation process employed to improve the characteristic of the fabricated TFT panel. However the silicon nitride layer utilized in the LTPS technology reduces the transmittance of the LCD panel fabricated by the LTPS technology. The degradation mentioned above can be ignored when the request for the performance of the fabricated LCD panel is not so high. But, when the request for the resolution of the LCD panel is getting bigger, the request for transmittance of each pixel of the fabricated LCD panel is getting higher.

In the tide of high resolution, even a little degradation in transmittance of each pixel of the LCD panel will greatly reduce the transmittance of the entire LCD panel. When the request for the resolution of the LCD panel is not so high, the worse performance of the LCD panel can still be ignored. So the silicon nitride layer is still necessary in the fabricated TFT LCD. However, with the need for the transmittance and performance getting greater, the problem resulting from the silicon nitride layer must be resolved without causing other manufacturing problems.

SUMMARY OF THE INVENTION

Because of the need for high resolution, it is necessary to design the pixel of high aperture rate and it is also necessary to consider the transmittance of each semiconductor layer. But as the need for the transmittance of the LCD getting greater, it is very important to increase the transmittance of the TFT LCD panel.

According to the purpose mentioned above, the present invention proposes a method for manufacturing TFT panel, which can increase the transmittance of the TFT panel. The foregoing method includes an intermediate-layer process. After the intermediate-layer process has been executed, use the source conductive pattern and the drain conductive pattern are used the mask in an etching step to remove the silicon nitride layer without the shield of the source conductive pattern and the drain conductive pattern. So the transmittance of the fabricated TFT panel is greatly increased.

According to the present invention, the intermediate-layer process can have three aspects. In the first aspect, the first step is to bake the TFT panel, so the silicon nitride layer is utilized to proceed with the hydrogenation process. The following step is to form the contact hole in the insulating layer of the TFT panel. Finally, form the source conductive pattern and the drain conductive pattern are formed. In the second aspect, the first step is to form the contact hole in the insulating layer of the TFT panel, then form the source conductive pattern and the drain conductive pattern, followed by baking the TFT panel including the source conductive pattern and the drain conductive pattern. In the third aspect, the first step is to form the contact hole in the insulating layer of the TFT panel, then sputtering a metallic layer on the TFT panel followed by a baking step. Then the metallic layer is etched to form the source conductive pattern and the drain conductive pattern.

The TFT panel mentioned in the three aspects of the preferred embodiment of the present invention includes the source conductive pattern and the drain conductive pattern, the TFT panel includes the gate polysilicon, the gate channel layer, gate insulating layer, and the silicon nitride layer. In addition, the TFT panel is formed on the base -transparent substrate, and the transparent substrate in the present invention can be made of glass. Besides, the LTPS technology is used to fabricate the TFT panel and the gate channel can be made of poly-crystalline silicon. The baking step mentioned above remains at about 350–450° C. for more than about half an hour.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

In fabricating the TFT (thin film transistor) LCD (Liquid Crystal Display) panel utilizing the LTPS (Low Temperature Poly Silicon) technology, a silicon nitride layer is necessary. When the request for the resolution of the TFT LCD panel is still low, the attenuation in transmittance resulting from the silicon nitride layer is still negligible. Thus other methods are utilized to raise the performance of the TFT LCD panel with the silicon nitride layer inside. However, the present invention proposes a TFT process with high transmittance, which has the advantage of using silicon nitride layer, without involving the disadvantages resulted from the silicon nitride layer. So the disadvantage such as attenuation in transmittance of the fabricated TFT resulting from the silicon nitride layer is averted in the present invention.

Figure 1:
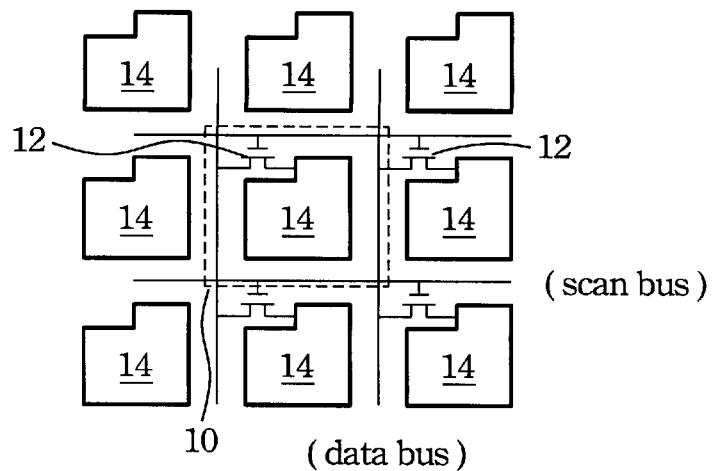
FIG. 1 illustrates the connection between the ITO electrode and the TFT, which connected to the scan bus and the data bus.

Usually, the TFT LCD is composed of a bottom substrate having a TFT array and pixel electrodes on it, and a top substrate having a color filter on it. The liquid crystal is filled between the top substrate and the bottom substrate. As shown in FIG. 1, in each pixel, whether a pixel 10 is transparent or oblique is determined by the ITO (Indium Tin Oxide) layer 14 controlled by the TFT (Thin Film Transistor) 12. The TFT 12 is used to control the signal fed to the transparent electrode composed of ITO layer 14. The direction of the liquid crystal molecule can be changed by the voltage of the signal fed to the transparent electrode composed of ITO layer 14. By using two perpendicularly arranged polarizers on both sides of the display, the transmittance of each may be controlled pixel by the signal fed into the pixel electrode. Coming back to the TFT plate, the basic structure of each unit pixel 10 is a TFT 12 with its source electrode connected to the data bus and gate electrode connected to the scan bus, while the drain electrode is connected to the transparent pixel electrode made of ITO 14.

However, when the request for high resolution of the TFT LCD panel arises day by day, and the scale of the TFT LCD is getting larger, the transmittance of each unit pixel is getting more important. As the manufacturing technology of the TFT LCD proceeds, the request for the performance of the TFT is getting higher. So the present invention will be more important when the manufacture technology of the TFT LCD proceeds. There are many types of TFT LCD, the present invention can be applied to any type of TFT LCD, such as the frequently used top gate or the bottom gate TFT. So even the present invention is utilized in the LTPS technology, and the silicon nitride layer is used when fabricating the TFT LCD, the TFT LCD fabricated by the method according to the present invention still has more than 30% higher transmittance than the traditional TFT LCD more than.

Figure 2:
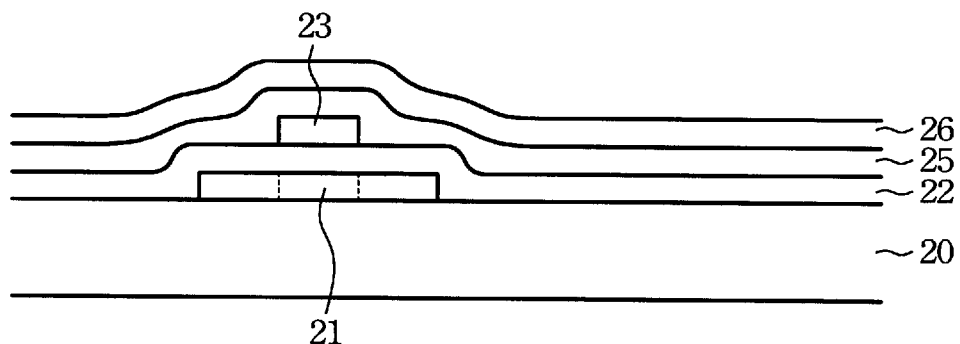
FIG. 2 illustrates the cross section of the silicon nitride layer formed on the TFT panel according to one preferred embodiment of the present invention.
Figure 3:
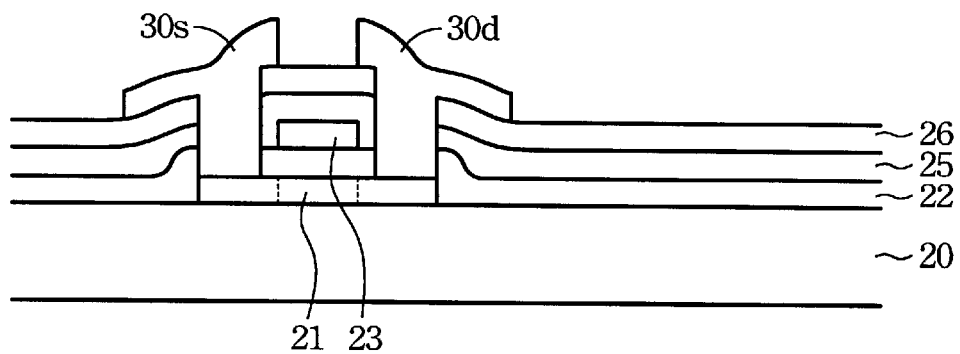
FIG. 3 illustrates the cross section after the drain conductive pattern and the source conductive pattern have been formed on the TFT panel according to one preferred embodiment of the present invention.

Although the method utilized to fabricate the top gate TFT is used as the preferred embodiment of the present invention, the present invention can be employed to apply to the other type of TFT LCD. Referring to FIG. 2, in the preferred embodiment of the present invention, the first conductive layer is formed on the transparent substrate 20, and then a photoresist layer is formed on the first conductive layer followed by a lithography step. Then an etching step is utilized to etch the exposed first conductive layer using the developed photoresist layer as a mask. Thus the first conductive layer is etched to form a first conductive pattern 21 under the mask (the developed photoresist layer), and the first conductive layer acts as the conductive channel of the transistor that is to be fabricated. In the preferred embodiment of the invention, the transparent substrate 20 can be made of glass, and the first conductive layer can be made of poly-crystalline silicon. In addition, the first conductive pattern 21 includes the source region and the drain region, which act as the source and drain of the TFT. The first insulating layer 22 is formed on the first conductive pattern 21 and on the exposed substrate 20. Similar to the fabrication of the first conductive pattern 21, the second conductive pattern 23 is formed on the first insulating layer 22 over the first conductive pattern 21. The second insulating layer 25 is formed on the second conductive pattern 23 and the exposed first insulating layer 22. The third insulating layer 26 is formed on the second insulating layer 25. In addition, the first insulating layer 22 acts as the gate oxide layer of the TFT, and can be made of silicon dioxide. Besides, the second conductive pattern 23 can be made of conductive metal, the second insulating layer 25 can be made of silicon nitride, and the third insulating layer 26 can be made of silicon nitride (SiNx).

After the second insulating layer 25 and the third insulating layer 26 have been formed, according to the first aspect of the preferred embodiment of the present invention, the next step is to proceed with a baking step to effect a hydrogenation process. Then a portion of the third insulating layer 26, a portion of the second insulating layer 25, and a portion of the first insulating layer 22 are modified to form the contact hole exposing a portion of the first conductive pattern 21. In other words, the source region and the drain region of the first conductive pattern 21 are exposed by the contact hole. The next step is not only to form a third conductive layer in the contact hole, but also on the source region and drain region of the exposed portion of the first conductive pattern 21, as well as on the third insulating layer 26. Followed by a patterning step, the drain conductive pattern 30*d* and the source conductive pattern 30*s* are formed thereby. Then the drain conductive pattern 30*d* and the source conductive pattern 30*s* are used as masks in an etching step, which is utilized to remove the exposed third insulating layer 26 until the second insulating layer 25 is exposed.

The following is according to the second aspect of the preferred embodiment of the present invention. After the second insulating layer 25 and the third insulating layer 26 have been formed, the next step is to etch a portion of the third insulating layer 26, a portion of the second insulating layer 25, and a portion of the first insulating layer 22 to form the contact hole exposing a portion of the first conductive pattern 21. In other words, the source region and the drain region of the first conductive pattern 21 are exposed by the contact hole. The next step is not only to form a third conductive layer in the contact hole, but also on the source region and drain region of the exposed portion of the first conductive pattern 21, as well as on the third insulating layer 26. Followed by a patterning step, the drain conductive pattern 30*d* and the source conductive pattern 30*s* are formed thereby. Then a baking step is undertaken with a hydrogenation process. Then use the drain conductive pattern 30*d* and the source conductive pattern 30*s* are used as masks in an etching step, which is utilized to remove the exposed third insulating layer 26 until the second insulating layer 25 exposed.

The following is according to the third aspect of the preferred embodiment of the present invention. After the second insulating layer 25 and the third insulating layer 26 have been formed, the next step is to etch a portion of the third insulating layer 26, a portion of the second insulating layer 25, and a portion of the first insulating layer 22 to form the contact hole exposing a portion of the first conductive pattern 21. In other words, the source region and the drain region of the first conductive pattern 21 are exposed by the contact hole. The next step is not only to form a third conductive layer in the contact hole, but also on the source region and drain region of the exposed portion of the first conductive pattern 21, as well as on the third insulating layer 26. Then TFT panel mentioned above is baked to proceed with a hydrogenation process, followed by a patterning step, the drain conductive pattern 30d and the source conductive pattern 30s are formed thereby. Then use the drain conductive pattern 30d and the source conductive pattern 30s are used as masks in an etching step, which is utilized to remove the exposed third insulating layer 26 until the second insulating layer 25 is exposed.

Figure 4:
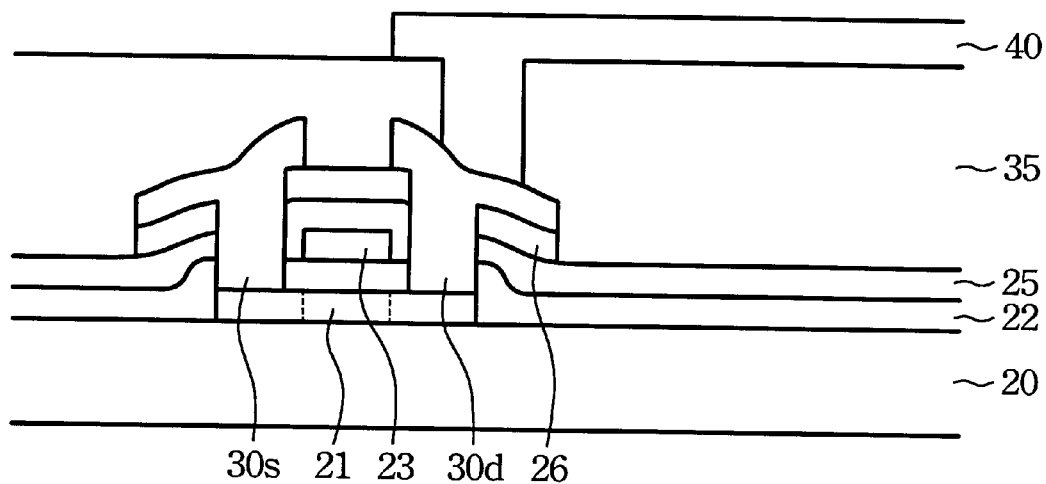
FIG. 4 illustrates the cross section after the etching step using the drain conductive pattern and the source conductive pattern as mask to etch the silicon nitride layer, and the ITO electrode has been formed connecting to the drain conductive pattern of the TFT panel according to one preferred embodiment of the present invention.
Figure 5:
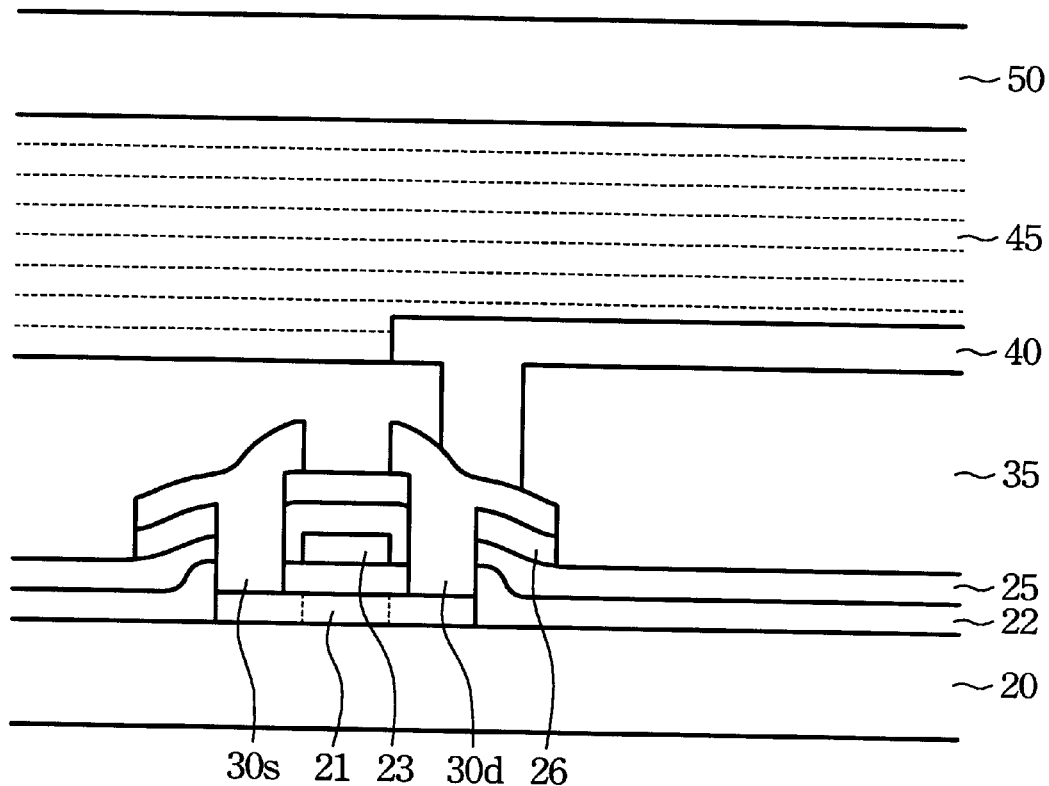
FIG. 5 illustrates the cross section of the TFT panel, which has liquid crystal injected between the top substrate and the bottom substrate.

Referring to FIG. 4, according to the preferred embodiment of the present invention, a fourth insulating layer 35 is formed on the glass substrate, i.e., on the exposed second insulating layer 25, the drain conductive pattern 30d, and the source conductive pattern 30s. After an optional planarization step has been applied to the TFT panel, which is to planarize the fourth insulating layer 35. A lithography and an etching step is then utilized to etch a portion of the fourth insulating layer 35, thus the contact hole formed in the fourth insulating layer 35 exposes a portion of the drain conductive pattern 30d. Then the fourth conductive layer is formed on the fourth insulating layer 35 and the exposed portion of the drain conductive pattern 30d, and then pattern the fourth conductive layer is patterned to form the fourth conductive pattern 40. In the preferred embodiment of the present invention, the fourth conductive layer can be made of ITO (Indium Tin Oxide). After the fourth conductive pattern 40 has been formed, the following processes are similar to those of the prior art that fabricate the TFT LCD. For example, the liquid crystal 45 is injected between the top substrate 50 and the fourth conductive pattern 40 and the exposed fourth insulating layer 35. Thus the TFT LCD is finished, and the cross section is shown in FIG. 5.

The voltage of the ITO layer is controlled by the TFT, i.e., the TFT is used to control the signal fed to the transparent electrode composed of ITO. And the direction of the liquid crystal molecule can be changed by the voltage of the signal fed to the transparent electrode composed of ITO. By using two perpendicularly arranged polarizers on both sides of the LCD panel, we can control the transmittance of each pixel by the signal fed into the pixel electrode (ITO layer).

In the preferred embodiment of the present invention, the temperature of the baking step needs to be maintained at about 350–450° C. for about 30 minutes. After the silicon nitride layer has been etched, though the silicon nitride layer is not a blanket layer. The underlying silicon nitride layer still has good characteristics because of the baking step in the preferred embodiment of the present invention. Thus the conductive material of the drain conductive pattern and the source conductive pattern has an Ohmic contact to the ion-doped poly-crystalline silicon, so the TFT LCD panel fabricated by the method in the present invention can work properly and have a higher transmittance without a blanket silicon nitride layer. In general, the TFT according to the present invention has a transmittance higher than the prior art by more than 30 percent.

In conclusion, according to the present invention, the TFT process with high transmittance includes an intermediate-layer process. After the intermediate-layer process, the source conductive pattern and the drain conductive pattern are used as the masks in an etching step to remove the silicon nitride layer without the shield of the source conductive pattern and the drain conductive pattern. Thus the transmittance of the TFT panel is higher than that of the TFT panel before the silicon nitride layer is removed.

Figure 6:
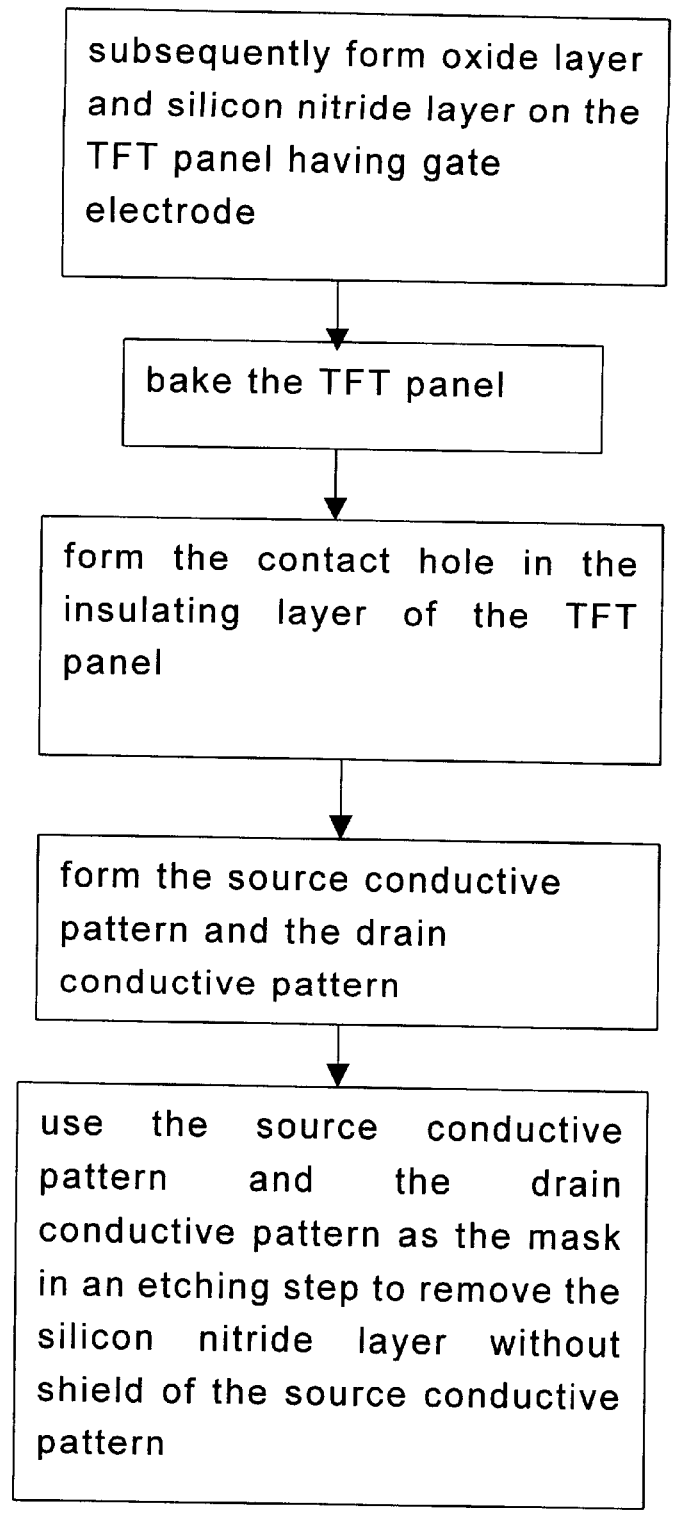
FIG. 6 illustrates the steps in the intermediate-layer step included in the first aspect of the preferred embodiment of the present invention.
Figure 7:
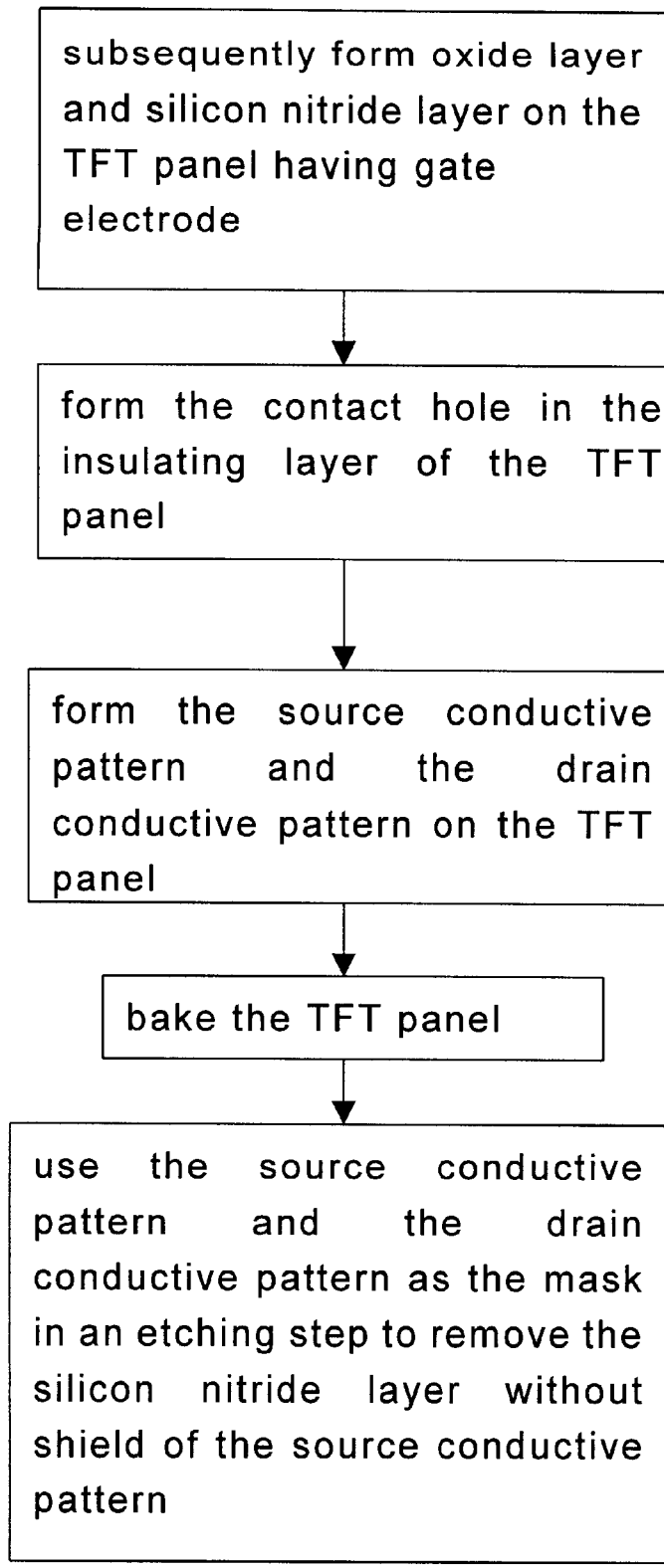
FIG. 7 illustrates the intermediate-layer step included in the second aspect of the preferred embodiment of the present invention.
Figure 8:
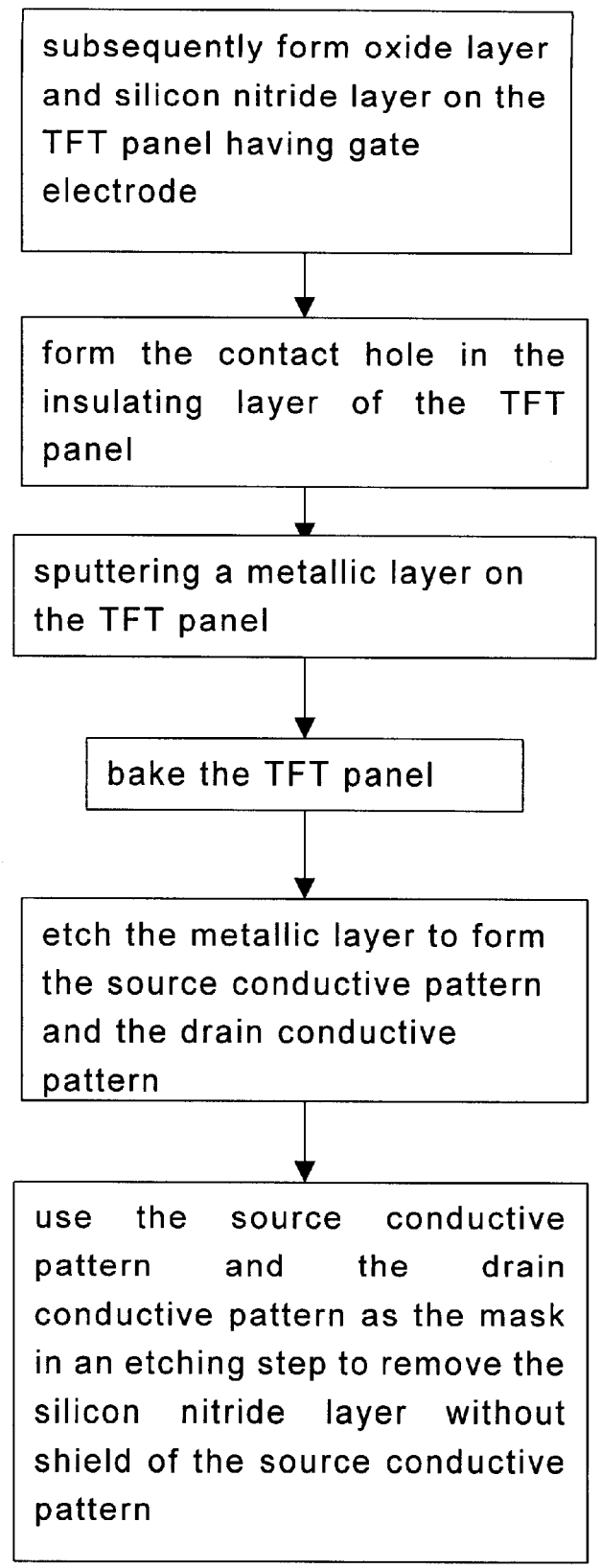
FIG. 8 illustrates the intermediate-layer step included in the third aspect of the preferred embodiment of the present invention.

According to the present invention, the intermediate-layer process can have three aspects. In the first aspect, the first step is to bake the TFT panel, then the contact hole is formed in the insulating layer of the TFT panel. Finally, the source conductive pattern and the drain conductive pattern are formed. The steps of the first aspect of the intermediate-layer step mentioned above are shown in FIG. 6. In the second aspect, the first step is to form the contact hole in the insulating layer of the TFT panel, then to form the source conductive pattern and the drain conductive pattern, followed by baking the TFT panel including the source conductive pattern and the drain conductive pattern. The steps of the second aspect of the intermediate-layer step mentioned above are shown in FIG. 7 and are discussed in relation thereto. In the third aspect, the first step is to form the contact hole in the insulating layer of the TFT panel, then a metallic layer is sputtered on the TFT panel followed by a baking step. Then etch the metallic layer is etched to form the source conductive pattern and the drain conductive pattern. The steps of the third aspect of the intermediate-layer step mentioned above are shown in FIG. 8 and are discussed in relation thereto.

The TFT panel mentioned in the three aspects of the preferred embodiment of the present invention includes the source conductive pattern and the drain conductive pattern, the TFT panel includes the gate polysilicon, the gate channel layer, the gate insulating layer, and the silicon nitride layer. In addition, the TFT panel is formed on the transparent substrate, and the transparent substrate in the present invention can be made of glass. In addition, the LTPS technology is used to fabricate the TFT panel and the gate channel can be made of poly-crystalline silicon. The baking step mentioned above is undertaken at a temperature which is maintained at about 350–450° C. for more than about half an hour.

As will be understood by persons skilled in the art, the foregoing preferred embodiment of the present invention is illustrative of the present invention rather than limiting the present invention. Having described the invention in connection with a preferred embodiment, for example, if the various etchants are used in the preferred embodiment, the modification will now suggest itself to those skilled in the art. While the preferred embodiment of the invention has been illustrated and described, it will be appreciated that various changes can be made therein without departing from the spirit and scope of the invention.

What is claimed is:

1. A method for fabricating a TFT (Thin Film Transistor) comprising:

forming a first conductive layer on a transparent substrate;

patterning said first conductive layer to form a first conductive pattern on said transparent substrate;

forming a first insulating layer on said first conductive pattern and said exposed transparent substrate;

forming a second conductive layer on said first insulating layer;

patterning said second conductive layer to form a second conductive pattern on said first insulating layer, said second conductive pattern being positioned over the first conductive pattern;

forming a second insulating layer on said second conductive pattern and said exposed first insulating layer;

forming a third insulating layer on said second insulating layer;

baking said first conductive pattern, said first insulating layer, said second conductive pattern, said second insulating layer, and said third insulating layer;

etching a portion of said third insulating layer, a portion of said second insulating layer, and a portion of said first insulating layer to form a first contact hole and a second contact hole in said third insulating layer, said second insulating layer, and said first insulating layer as well as to expose a first portion of said first conductive pattern and a second portion of said first conductive pattern, said first contact hole and said second contact hole being positioned at both ends of said first conductive pattern;

forming a third conductive layer in said first contact hole, in said second contact hole, and said third insulating layer;

patterning said third conductive layer to form a source conductive pattern and a drain conductive pattern on said third insulating layer; and etching said third insulating layer using said source conductive pattern and said drain conductive pattern as a mask until said second insulating layer is exposed to form said TFT on a TFT panel, said second conductive pattern being a gate of said TFT, said source conductive pattern and drain conductive pattern being source and drain of said TFT, transmittance of said TFT panel after etching said third insulating layer being larger than transmittance of said TFT panel before etching said third insulating layer.

2. The method as claim 1, wherein said transparent substrate is composed of glass.

3. The method as claim 1, wherein said first conductive layer is composed of poly-crystalline silicon.

4. The method as claim 1, wherein said third insulating layer is composed of silicon nitride (SiNx).

5. The method as claim 1, wherein said baking step is remained at about 350–450° C. for about 30 minutes.

6. The method as claim 1, wherein said third conductive layer is composed of metal.

7. A method for fabricating a TFT (Thin Film Transistor) comprising:

forming a first conductive layer on a transparent substrate;

patterning said first conductive layer to form a first conductive pattern on said transparent substrate;

forming a first insulating layer on said first conductive pattern and said exposed transparent substrate;

forming a second conductive layer on said first insulating layer;

patterning said second conductive layer to form a second conductive pattern on said first insulating layer, said second conductive pattern being positioned over the first conductive pattern;

forming a second insulating layer on said second conductive pattern and said exposed first insulating layer;

forming a third insulating layer on said second insulating layer;

etching a portion of said third insulating layer, a portion of said second insulating layer, and a portion of said first insulating layer to form a first contact hole and a second contact hole in said third insulating layer, said second insulating layer, and said first insulating layer as well as to expose a first portion of said first conductive pattern and a second portion of said first conductive pattern, said first contact hole and said second contact hole being positioned at both ends of said first conductive pattern;

forming a third conductive layer in said first contact hole, in said second contact hole, and said third insulating layer;

patterning said third conductive layer to form a source conductive pattern and a drain conductive pattern on said third insulating layer;

baking said first conductive pattern, said etched first insulating layer, said second conductive pattern, said etched second insulating layer, said etched third insulating layer, said source conductive pattern and said drain conductive pattern to form Ohmic contact between said first portion of said first conductive pattern and said drain conductive pattern, and to form Ohmic contact between said second portion of said first conductive pattern and said source conductive pattern; and etching said third insulating layer using said source conductive pattern and said drain conductive pattern as a mask until said second insulating layer is exposed to form said TFT on a TFT panel, said second conductive pattern being a gate of said TFT, said source conductive pattern and drain conductive pattern being source and drain of said TFT, transmittance of said TFT panel after etching said third insulating layer being larger than transmittance of said TFT panel before etching said third insulating layer.

8. The method as claim 7, wherein said transparent substrate is composed of glass.

9. The method as claim 7, wherein said first conductive layer is composed of poly-crystalline silicon.

10. The method as claim 7, wherein said third insulating layer is composed of silicon nitride (SiNx).

11. The method as claim 7, wherein said baking step is remained at about 350–450° C. for about 30 minutes.

12. The method as claim 7, wherein said third conductive layer is composed of metal.

13. A method for fabricating a TFT (Thin Film Transistor) comprising:

forming a first conductive layer on a transparent substrate;

patterning said first conductive layer to form a first conductive pattern on said transparent substrate;

forming a first insulating layer on said first conductive pattern and said exposed transparent substrate;

forming a second conductive layer on said first insulating layer;

patterning said second conductive layer to form a second conductive pattern on said first insulating layer, said second conductive pattern being positioned over the first conductive pattern;

forming a second insulating layer on said second conductive pattern and said exposed first insulating layer;

forming a third insulating layer on said second insulating layer;

etching a portion of said third insulating layer, a portion of said second insulating layer, and a portion of said first insulating layer to form a first contact hole and a second contact hole in said third insulating layer, said second insulating layer, and said first insulating layer as well as to expose a first portion of said first conductive pattern and a second portion of said first conductive pattern, said first contact hole and said second contact hole being positioned at both ends of said first conductive pattern;

sputtering a third conductive layer in said first contact hole, in said second contact hole, and said third insulating layer;

baking said first conductive pattern, said etched first insulating layer, said second conductive pattern, said etched second insulating layer, said etched third insulating layer, said source conductive pattern and said drain conductive pattern to form Ohmic contact between said first portion of said first conductive pattern and said drain conductive pattern, and to form Ohmic contact between said second portion of said first conductive pattern and said source conductive pattern;

patterning said third conductive layer to form a source conductive pattern and a drain conductive pattern on said third insulating layer; and etching said third insulating layer using said source conductive pattern and said drain conductive pattern as a mask until said second insulating layer is exposed to form said TFT on a TFT panel, said second conductive pattern being a gate of said TFT, said source conductive pattern and drain conductive pattern being source and drain of said TFT, transmittance of said TFT panel after etching said third insulating layer being larger than transmittance of said TFT panel before etching said third insulating layer.

14. The method as claim 13, wherein said transparent substrate is composed of glass.

15. The method as claim 13, wherein said first conductive layer is composed of poly-crystalline silicon.

16. The method as claim 13, wherein said third insulating layer is composed of silicon nitride (SiNx).

17. The method as claim 13, wherein said baking step is remained at about 350–450° C. for about 30 minutes.

18. The method as claim 13, wherein said third conductive layer is composed of metal.

* * * * *